United States Patent
Ramos et al.

(10) Patent No.: US 7,310,242 B2
(45) Date of Patent: Dec. 18, 2007

(54) SELF-SHIELDING HIGH VOLTAGE DISTRIBUTION BOX

(75) Inventors: Sergio Ramos, Harbor City, CA (US); Eugene M. Steele, Cypress, CA (US); James P. Souther, Los Angeles, CA (US)

(73) Assignee: General Motors Corporation

( * ) Notice: Subject to any disclaimer, the term of this patent is extended or adjusted under 35 U.S.C. 154(b) by 211 days.

(21) Appl. No.: 10/850,724

(22) Filed: May 21, 2004

(65) Prior Publication Data

US 2005/0259408 A1 Nov. 24, 2005

(51) Int. Cl.
*H05K 9/00* (2006.01)

(52) U.S. Cl. ............. 361/818; 361/816; 361/800; 361/799; 361/753; 174/350; 439/607

(58) Field of Classification Search ........ 361/697, 361/702, 709, 730, 752, 753, 796, 800, 816, 361/818, 799; 174/350, 351, 353; 439/607
See application file for complete search history.

(56) References Cited

U.S. PATENT DOCUMENTS

| | | | | |
|---|---|---|---|---|
| 4,404,617 A * | 9/1983 | Ohyama et al. | ........... | 361/818 |
| 4,628,412 A * | 12/1986 | Nigorikawa | ........... | 361/816 |
| 4,833,276 A * | 5/1989 | Ito | ........... | 174/374 |
| 5,004,874 A * | 4/1991 | Theisen et al. | ........... | 218/151 |
| 5,091,823 A * | 2/1992 | Kanbara et al. | ........... | 361/697 |
| 5,430,618 A * | 7/1995 | Huang | ........... | 361/818 |
| 5,561,265 A * | 10/1996 | Livshits et al. | ........... | 174/386 |
| 5,673,172 A * | 9/1997 | Hastings et al. | ........... | 361/685 |
| 5,703,754 A * | 12/1997 | Hinze | ........... | 361/736 |
| 5,734,561 A * | 3/1998 | Wolf et al. | ........... | 361/800 |
| 5,808,780 A * | 9/1998 | McDonald | ........... | 359/290 |
| 5,831,847 A * | 11/1998 | Love | ........... | 363/141 |
| 5,847,938 A * | 12/1998 | Gammon | ........... | 361/816 |
| 5,872,332 A * | 2/1999 | Verma | ........... | 174/35 C |
| 6,011,700 A * | 1/2000 | Matsuzaki | ........... | 361/816 |
| 6,090,728 A * | 7/2000 | Yenni et al. | ........... | 442/117 |
| 6,122,394 A * | 9/2000 | Neukermans et al. | ........... | 382/124 |
| 6,133,886 A * | 10/2000 | Fariello et al. | ........... | 343/702 |
| 6,242,690 B1 * | 6/2001 | Glover | ........... | 174/35 GC |
| 6,323,418 B1 * | 11/2001 | Tiburtius et al. | ........... | 174/387 |
| 6,335,869 B1 * | 1/2002 | Branch et al. | ........... | 361/816 |
| 6,360,035 B1 * | 3/2002 | Hurst et al. | ........... | 385/18 |
| 6,384,703 B1 * | 5/2002 | Ramos et al. | ........... | 336/58 |
| 6,388,535 B1 * | 5/2002 | Otsuki et al. | ........... | 331/177 R |
| 6,407,925 B1 * | 6/2002 | Kobayashi et al. | ........... | 361/752 |
| 6,431,456 B2 * | 8/2002 | Nishizawa et al. | ........... | 235/492 |
| 6,462,958 B2 * | 10/2002 | Ogata | ........... | 361/800 |
| 6,483,719 B1 * | 11/2002 | Bachman | ........... | 361/816 |
| 6,485,595 B1 * | 11/2002 | Yenni et al. | ........... | 156/221 |
| 6,552,911 B1 * | 4/2003 | Mayer et al. | ........... | 361/752 |
| 6,595,789 B2 * | 7/2003 | Oota et al. | ........... | 439/98 |
| 6,975,444 B2 * | 12/2005 | Huibers | ........... | 359/291 |
| 2003/0226685 A1 * | 12/2003 | Murakami | ........... | 174/117 F |

* cited by examiner

*Primary Examiner*—Dean A. Reichard
*Assistant Examiner*—Dameon E. Levi

(57) ABSTRACT

A distribution box for enclosing an electrical connection in an electrical wiring system includes a housing that is resistive to penetration by electromagnetic fields and a plurality of electrical conductors that form the electrical connection. A mirror plate is disposed within the housing and generates mirror currents to suppress electromagnetic fields generated by current flowing through the plurality of electrical conductors.

12 Claims, 4 Drawing Sheets

SELF-SHIELDING HIGH VOLTAGE DISTRIBUTION BOX

FIELD OF THE INVENTION

The present invention relates to suppression of electromagnetic interference (EMI), and more particularly to EMI suppression in electrical systems of mobile platforms, such as automobiles, boats or aircraft.

BACKGROUND OF THE INVENTION

Mobile platforms typically include function modules that provide electrical power. Exemplary function modules include, but are not limited to, propulsion modules, power steering modules, environmental control modules, security system modules, auxiliary power modules and speed control modules. Mobile platforms now use high voltage electrical systems. For example, electric vehicles (EV's) and fuel cell vehicles utilize high voltage electrical propulsion modules.

The current flowing through wiring harnesses of function modules emits electromagnetic fields that can cause interference. For example, EMI generated from the wiring harness of the power steering module may create unwanted parasitic current. Additionally, the EMI may cause processor or memory malfunctions in the modules of the mobile platform. Line filters enclosed in shrouds are used to suppress the EMI. The shrouds typically include metallic boxes that surround the filter. Generally, the line filters reduce the EMI. The shrouds attempt to prevent the EMI from interfering with surrounding electrical components and wiring. Although somewhat effective in controlling EMI, the use of line filters and shrouds increase cost, size and complexity.

Furthermore, the wiring harnesses of the function modules typically include a plurality of wire leads that are connected in a plurality of locations throughout the harness. Such wiring harnesses often include an abundance of redundant connection points, wires of excessive length and inefficient routing.

SUMMARY OF THE INVENTION

Accordingly, the present invention provides a distribution box for enclosing an electrical connection in an electrical wiring system. The distribution box includes a housing that is resistive to penetration by electromagnetic fields and a plurality of electrical conductors that form the electrical connection. A mirror plate is disposed within the housing and generates mirror currents to suppress electromagnetic fields generated by current flowing through the plurality of electrical conductors.

In one feature, the housing includes a removable lid that is resistive to penetration by electromagnetic fields. An upper edge of a perimeter wall of the housing is configured to mate with the lid to impede electromagnetic fields from passing between the housing and the lid.

In another feature, the housing includes a material that is highly resistive to penetration by electromagnetic fields.

In another feature, the housing comprises a plurality of ports for ingress and egress of said plurality of electrical conductors. A collar is associated with each of the plurality of ports. The collars enable passage of at least one of the plurality of electrical conductors therethrough and suppress emission of electromagnetic fields. Each collar includes a material that is highly resistive to penetration by electromagnetic fields. Each collar extends from the housing a distance that is based on a diameter of an associated electrical conductor cable passing therethrough.

In still another feature, a bus bar is disposed within the housing and is electrically connected to a first terminal of a power source. The mirror plate is electrically connected to a second terminal of the power source. A fuse is also included an has a first terminal that is electrically connected to the bus bar and a second terminal that is electrically connected to one of the plurality of electrical conductors.

In yet another feature, an interlock safety switch discharges voltage within the distribution box when the housing is opened.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
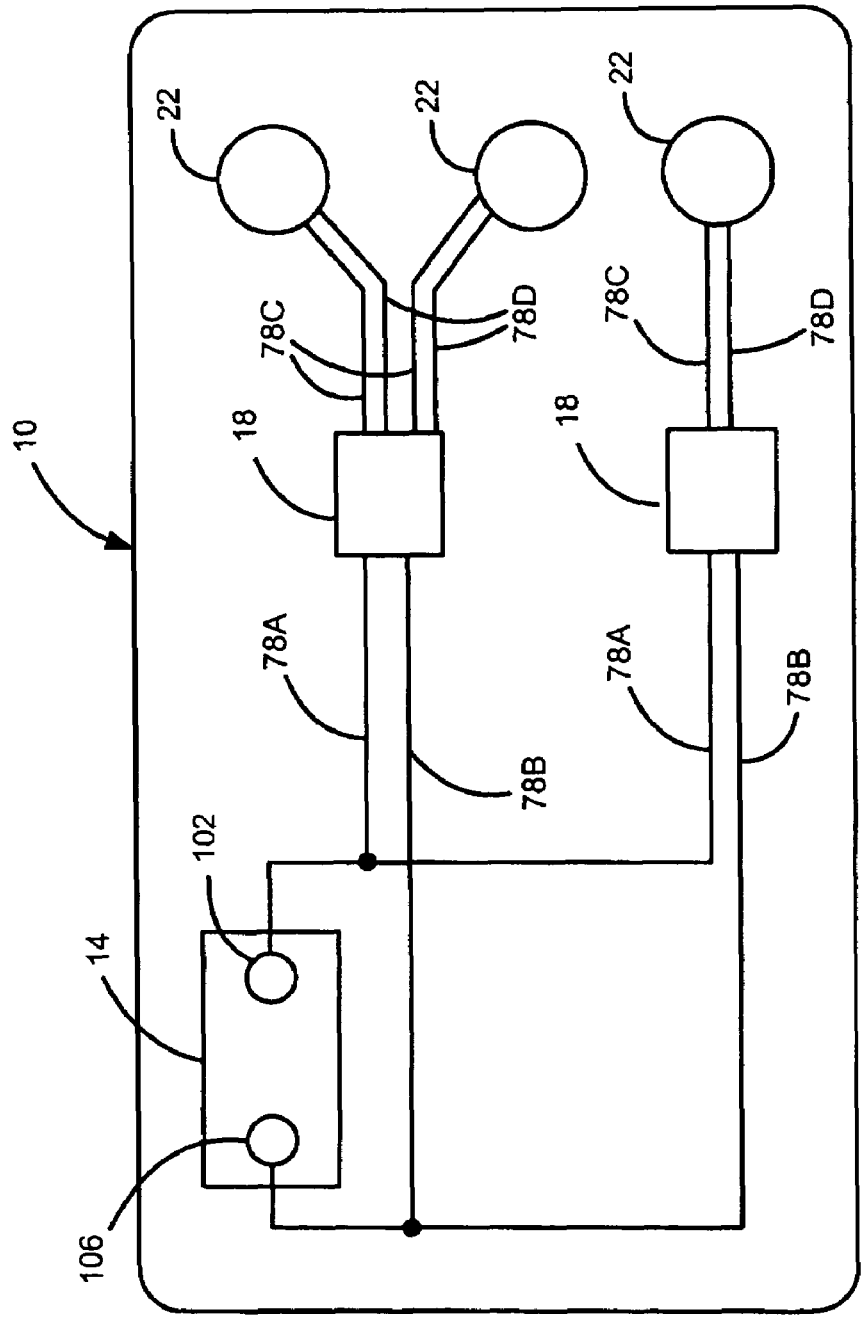
FIG. 1 is a functional block diagram of an operation management system that controls operational functions of a mobile platform according to the present invention.

The following description of the preferred embodiment is merely exemplary in nature and is in no way intended to limit the invention, its application, or uses. For purposes of clarity, the same reference numbers will be used in the drawings to identify similar elements.

FIG. 1 is a function block diagram of an operation management system 10 that controls operational functions of a mobile platform, such as automobiles, boats or aircraft. The operation management system 10 includes a power source 14, such as a battery, and at least one universal self-shielding distribution box 18. The distribution box 18 is a self-shielding electrical connection enclosure that provides protection against EMI without requiring the operation management system 10 to include a plurality of filters and shields.

The distribution box 18 encloses at least one electrical junction between the power source 14 and at least one function module 22. The function module 22 can include, but is not limited to, propulsion modules, steering modules, environmental control modules, security system modules, auxiliary power modules, and speed control modules. If the operation management system 10 includes a plurality of function modules 22, the distribution box 18 can include a plurality of electrical junctions to serve as a central junction point for a plurality of electrical connections. The central junction point eliminates excessive components, reduces redundant wiring, and reduces the length of wires in each electrical connection.

The distribution box 18 is scalable in that additional electrical connections can be added within the distribution box 18. For example, if the operation management system 10 includes three function modules 22 and one distribution box 18, electrical connections for fourth and fifth function modules 22 can be added to the distribution box 18. Furthermore, the distribution box 18 is universal in that the distribution box 18 can be used at any point within operation management system 10. In other words, the same distribution box 18 can be used to enclose an electrical junction for a braking module and an interior lighting module. Therefore, different electrical connection enclosures are not required. Instead, a plurality of identical distribution boxes 18 can be used throughout the operation management system 10.

Figure 2:
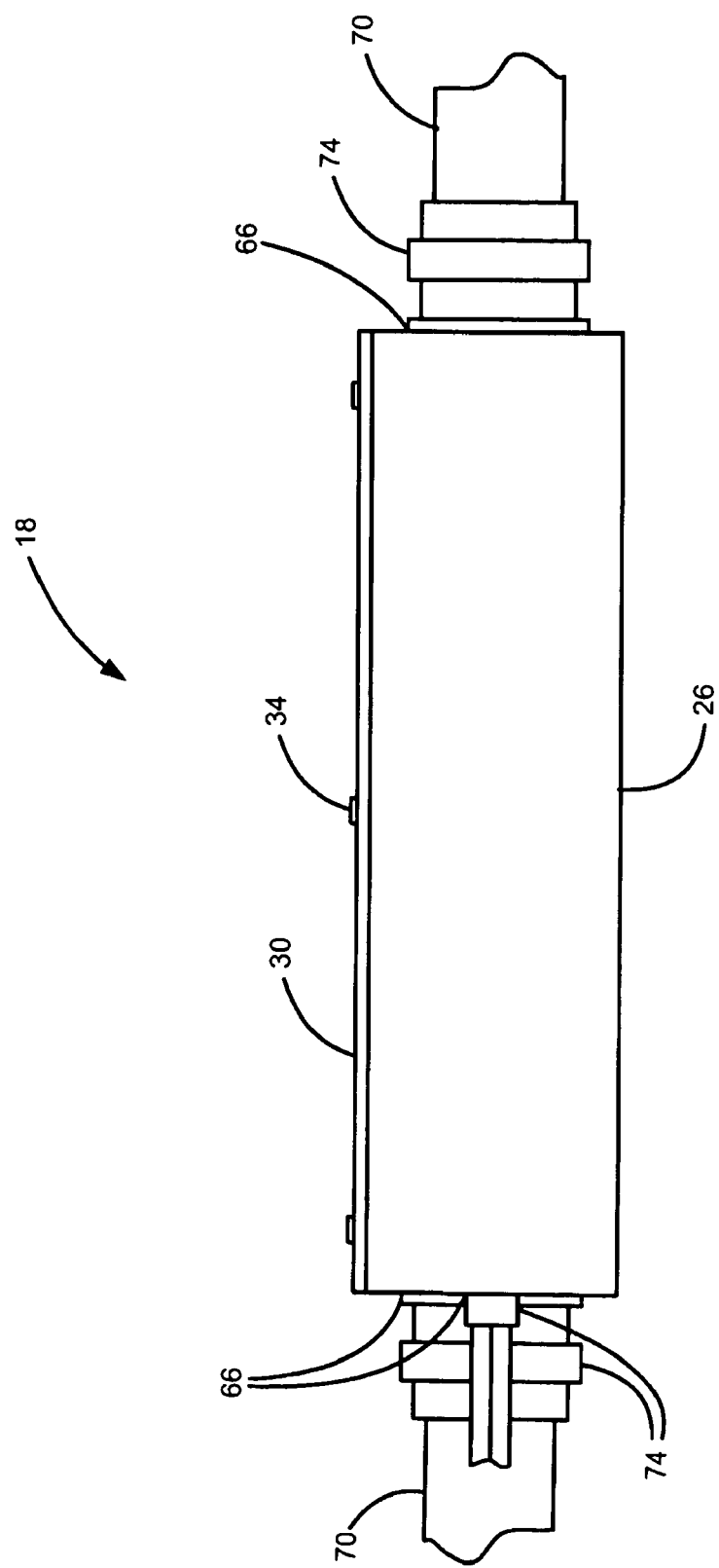
FIG. 2 is a side view of a universal self-shielding distribution box of the operation management system.

Referring now to FIG. 2, a side view of the universal self-shielding distribution box 18 is shown. The distribution box 18 includes a housing 26 and a lid 30 that are constructed to be highly resistive to penetration by electromagnetic fields. For example, the housing 26 and the lid 30 can be constructed from an electromagnetic shielding alloy such as steel, nickel, aluminum and/or gold. The shielding alloy provides maximum attenuation of electromagnetic fields that are generated by the electrical junctions enclosed in the distribution box 18. The alloy is selected based on EMI shielding characteristics. For example, aluminum may be used to shield 15 to 20 decibels of EMI. Gold may be used to shield 40 to 50 decibels of EMI. Therefore, electromagnetic fields in the distribution box 18 do not radiate outside of the distribution box 18. Alternatively, the housing 26 and the lid 30 can be plated with a shielding alloy to resist penetration by electromagnetic fields.

The lid 30 is attached to the housing 26 using any suitable fastener that enables the lid 30 to be removed and re-installed when additional electrical connections are added. For example, as shown in FIG. 2, the lid 30 can be coupled to the housing 26 using screws 34. Alternatively, the lid 30 can be coupled to the housing 26 using snaps, latches, or any other releasable fastener. Additionally, the lid 30 is coupled to the housing 26 such that electromagnetic fields are substantially impeded from passing between the housing 26 and the lid 30.

Figure 3:
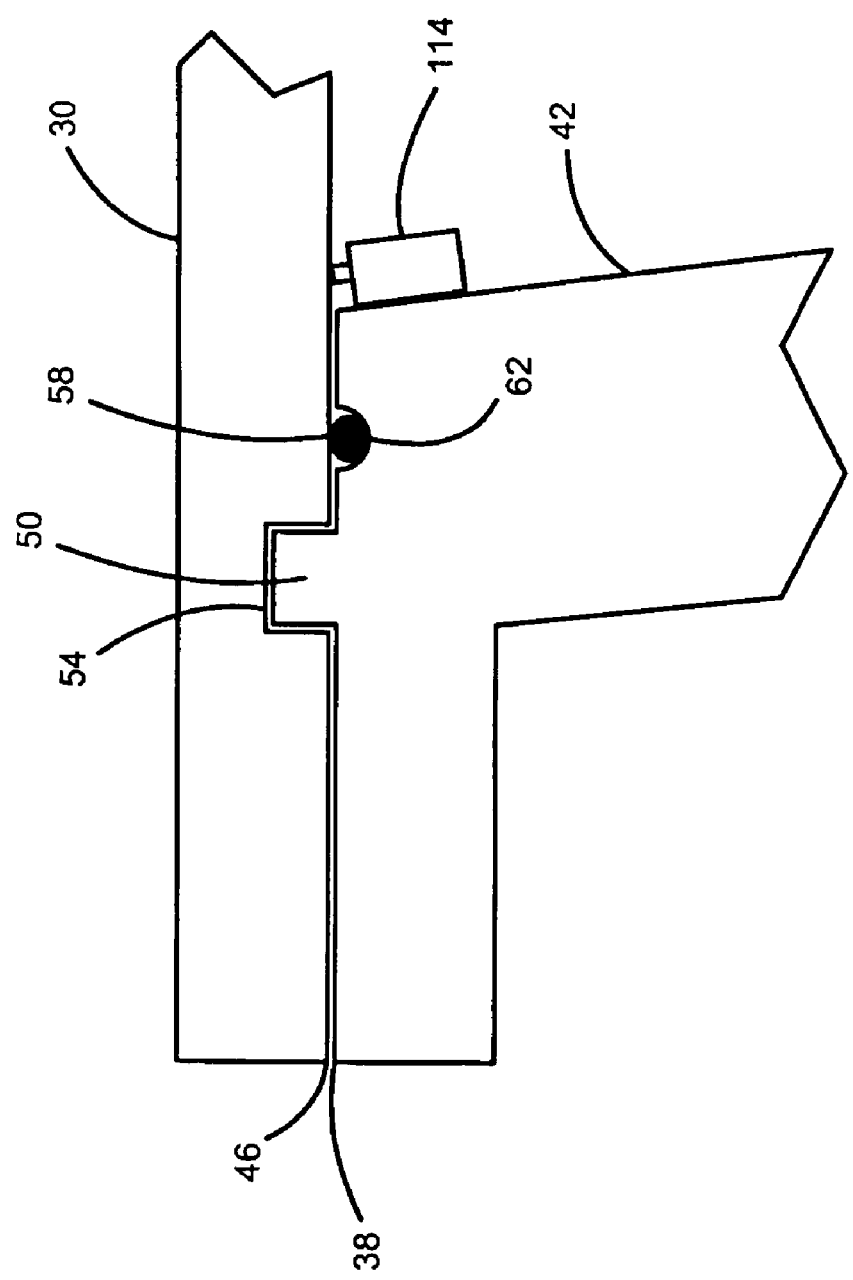
FIG. 3 is a sectional view of a portion of the distribution box of FIG. 2 illustrating attachment of a lid and housing.

Referring now to FIG. 3, a sectional view of an area of the distribution box 18 details mating of the lid 30 with an upper edge 38 of a perimeter wall 42 of the housing 26. The lid 30 mates with the upper edge 38 in a tongue-and-groove fashion to substantially impede electromagnetic fields from passing between the upper edge 38 and a bottom surface 46 of the lid 30. More specifically, the upper edge 38 includes a ridge 50 that extends along the entire upper edge 38 of the perimeter wall 42. Additionally, the bottom surface 46 of the lid 30 includes a groove 54 that extends along an entire perimeter area of the bottom surface 46. When the lid 30 is placed on the housing 26, the ridge 50 is positioned within the groove 54 to provide a barrier that substantially impedes electromagnetic fields from passing between the bottom surface 46 and the upper edge 38. This barrier provides integrity of the electromagnetic shielding characteristics throughout the area between the lid 30 and the housing 26 without regard to the spacing of the screws 34.

The distribution box 18 also includes a weather barrier 58 that prevents contaminates, such as water and dirt, from penetrating and damaging the enclosed electrical connections. The upper edge 38 can include an indentation 62 that extends along the entire perimeter of the upper edge 38. The weather barrier 58 is a solid cylindrical extrusion constructed of a resilient material that is impervious to moisture, dirt, grease, and any other contaminate surrounding the distribution box 18. The weather barrier 58 seats in the indentation 62 and is compressed between the bottom surface 46 and the upper edge 38 when the lid 30 is coupled to the housing 26. Alternatively, the weather barrier 58 can be a flat gasket that fits between the bottom surface 46 and the upper edge 38 or any other suitable device that will prevent contaminates from passing between the lid 30 and the housing 26.

Referring again to FIG. 2, the housing 26 includes a plurality of ports 66 for the ingress and egress of power conducting cables 70. The diameter of each port 66 is minimized so that electromagnetic fringing fields only extend approximately one port diameter into the distribution box 18. Collars 74 are coupled to the housing 26 within each port 66. Each collar 74 is used to retain at least one of the cables 70 and to suppress emissions of electromagnetic fields at the area where the cable 70 passes through the port 66. Each collar 74 includes a material that is highly resistive to penetration by electromagnetic fields. That is, each collar 74 is either constructed of, or plated with, a shielding alloy as described above in reference to the construction of the housing 26 and the lid 30. Each collar 74 can be coupled to the housing 26 by threading each collar 74 within a respective port 66. Alternatively, each collar 74 can be coupled to housing 26 using any suitable retention means. For example, each collar 74 can be cast, welded, molded, riveted, or glued to the housing 26 within a respective port 66.

Figure 4:
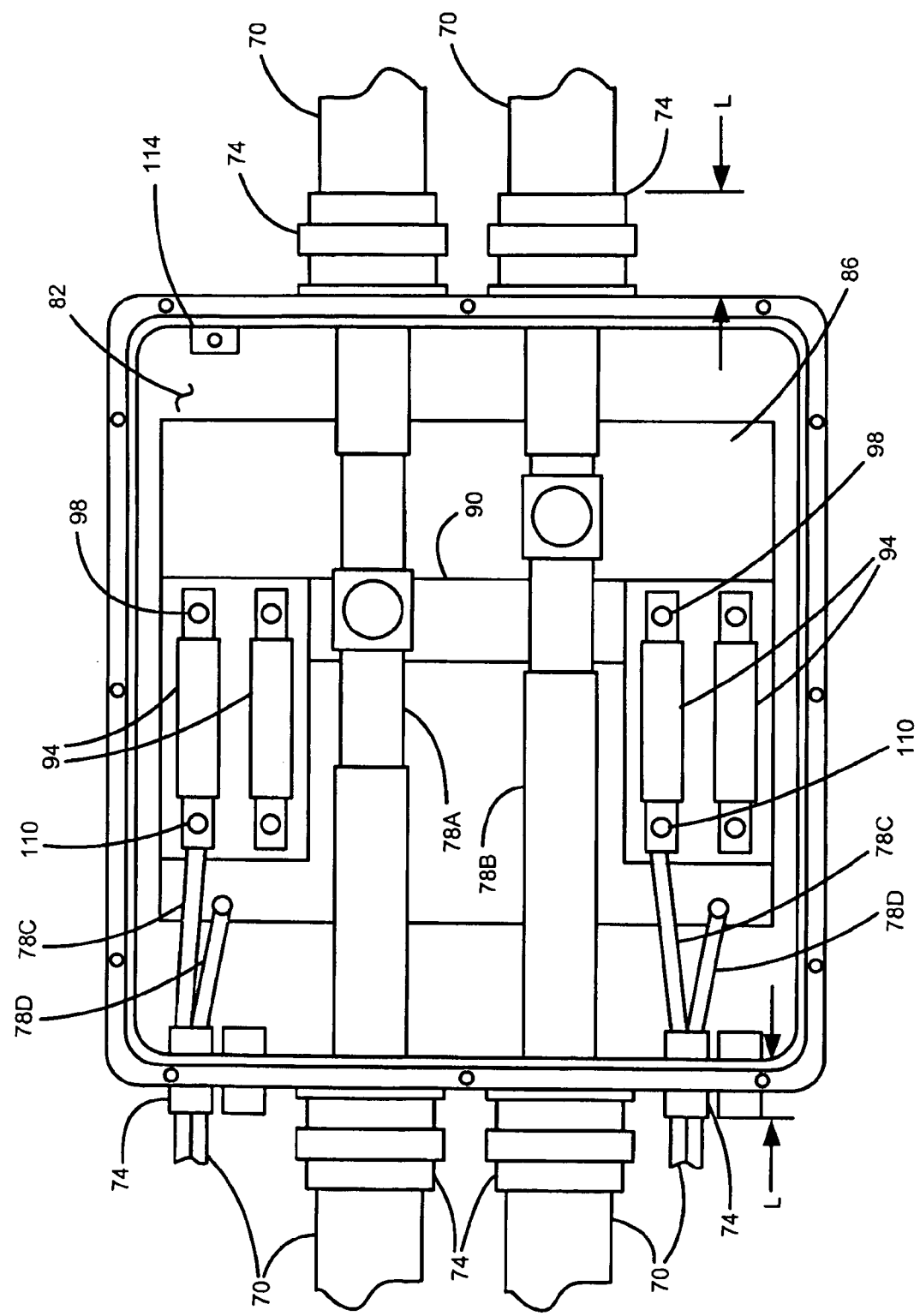
FIG. 4 is a top view of the distribution box of FIG. 2 with the lid removed.

Referring now to FIG. 4, a top view of the distribution box 18 is shown with the lid 30 removed. Each collar 74 extends from the housing 26 by a length L to provide additional suppression of electromagnetic fields radiating from the cables 70. The length L of each collar 74 is based on a desired amount of electromagnetic radiation suppression, the shielding alloy included in each collar 74 and the diameter of the cable 70 passing through the related collar 74. For example, the length L can be one to two times the diameter of the respective cable 70 passing therethrough, depending on the desired amount of electromagnetic radiation suppression.

Each cable 70 includes at least one wire 78 that is electrically connected with another wire 78 within an interior 82 of the housing 26. For clarity in describing the present invention, specific wires 78 will also be individually referred to as wires 78A, 78B, 78C and 78D. Additionally, as used herein, electrically connected means linking of a first point within the operation management system 10 to a second point to enable current flow from the first point to the second point. Linking can be accomplished by directly coupling the first point to the second point or by connecting the first point to the second point via an intermediary electrically conductive component, such as a fuse or a wire. For example, one wire 78 can be directly connected to another wire 78 or one wire 78 may be connected to one end of a fuse with another wire 78 connected to the other end of the fuse. In the later instance, the two wires 78 are electrically connected such that current flows through the intermediary component from the first point to the second point.

The distribution box 18 includes a mirror plate 86 located in the interior 82 of the housing 26. The mirror plate 86 produces mirror currents within the distribution box 18 and is grounded to the housing 26. The mirror plate 86 is oriented orthogonally to the electromagnetic fields radiated by current passing through the electrical junctions enclosed within the distribution box 18. The mirror currents generate electromagnetic fields that have an opposite polarity than the electromagnetic fields generated by current flowing through each wire 78 of each electrical connection. The opposing polarity of the electromagnetic fields generated by the mirror plate 86 substantially negate the electromagnetic fields radiated by current flowing through each electrical connection.

The distribution box 18 includes a bus bar 90 and at least one fuse 94 having a first terminal 98 electrically connected to the bus bar 90. The bus bar 90 is also electrically connected to a first terminal 102 of the power source 14 via the wire 78A. The mirror plate 86 is electrically connected to a second terminal 106 of the power source 14 via the wire 78B. Each function module 22 receives power from the power source 14 through the electrical connections enclosed in the distribution box 18. The wire 78C is electrically connected to a first point of the function module 22 and to a second terminal 110 of the fuse 94 to provide power to the function module 22. The wire 78D is electrically connected to the mirror plate 86 and to a second point of the function module 22.

As the power source 14 provides power, current flows from the first terminal 102 of the power source, through the wire 78A and through the bus bar 90 to the first terminal 98 of the fuse 94. Current passes through the fuse 94 and to the first point of the function module 22 through the wire 78C. Current flows through the function module 22 to provide power to the function module 22 and back to the mirror plate 86 through the wire 78D. Current flows through the mirror plate 86 to the second terminal 106 of the power source 14 via the wire 78B.

Current flows through the mirror plate 86 in a direction opposite to the direction of the current flowing between the first point of the function module 22 and the first terminal 102 of the power source 14. That is, current flows through the mirror plate 86 in the opposite direction than current flowing through the wire 78A, the bus bar 90, the fuse 94 and the wire 78C. Additionally, current flowing through the mirror plate 86 generates an electromagnetic field that has a polarity opposite to the polarity of the an electromagnetic field generated by current flowing between the first terminal 102 of the power source 14 and the function module 22. Therefore, any electromagnetic fields generated within the distribution box 18 by current flowing between the first terminal 102 and the function module 22 are substantially negated by the electromagnetic fields generated by current flowing through the mirror plate 86.

The topology of the wires 78, the fuse 94, the bus bar 90 and the mirror plate 86 within the distribution box 18 aids in the attenuation of electromagnetic fields. The topology places the wires 78, the fuse 94, the bus bar 90 and the mirror plate 86 in close proximity to a bottom surface of the housing 26 to minimize diffusion of the any electromagnetic fields radiated within the distribution box 18. By minimizing diffusion of the electromagnetic fields, the distribution box 18 further attenuates radiation of the electromagnetic fields.

Referring to FIGS. 3 and 4, the distribution box 18 further includes an interlock bus discharge switch 114 for discharging the voltage within the distribution box 18 when the lid 30 is uncoupled from the housing 26. The distribution box 18 includes at least one discharge resistor (not shown) connected across each fuse 94. When the lid 30 is uncoupled from the housing 26 the interlock bus discharge switch 114 causes the discharge resistor to discharge the voltage within the distribution box 18. The rate of discharge is based on the discharge resistor resistance rating. More particularly, the higher the resistance of the discharge resistor, the slower the discharge and vice-versa.

Referring again to FIG. 4, the topology of the distribution box 18 is symmetrical, whereby an equal number of fuses 94 are disposed on each side of the wires 78A and 78B. The symmetrical topology enables the electrical connections within the housing 26 to also be symmetrical. The symmetry of the electrical connections enables the wires 78 to have shorter lengths, thereby reducing the propagation of electromagnetic fields within the distribution box 18. Alternatively, the topology can be asymmetrical such that a plurality of fuses 94 and electrical junctions are not equally positioned on both sides of the wires 78A and 78B. The asymmetrical topology provides ease in manufacturing of the distribution box 18. The wires 78C and 78D can be twisted as they enter and exit the distribution box 18. Twisting the wires 78C and 78D also aids in the suppression of the electromagnetic fields radiating from the wires 78C and 78D.

Although the distribution box 18 has been described as a centralized junction point for electrical junctions between the function module 22 and the power source 14, the distribution box 18 can also be used for other electrical connections. For example, if the power source 14 is a battery, the distribution box 18 can be used as a connection point between a 120 volt power source, a battery charging function module 22 and the battery.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following

What is claimed is:

1. A distribution box for enclosing an electrical connection in an electrical wiring system, comprising:
    a housing that is resistive to penetration by electromagnetic fields;
    a plurality of electrical conductors that form said electrical connection having current flowing therethrough in a first direction; and
    a mirror plate disposed within said housing having current flowing therethrough in a second direction substantially opposite said first direction and generating electromagnetic fields to suppress electromagnetic fields generated by current flowing through said plurality of electrical conductors.

2. The distribution box of claim 1 wherein said housing includes a removable lid that is resistive to penetration by electromagnetic fields.

3. The distribution box of claim 2 wherein an upper edge of a perimeter wall of said housing is configured to mate with said lid to impede electromagnetic fields from passing between said housing and said lid.

4. The distribution box of claim 1 wherein said housing includes a material that is highly resistive to penetration by electromagnetic fields.

5. The distribution box of claim 1 wherein said housing comprises a plurality of ports for ingress and egress of said plurality of electrical conductors.

6. The distribution box of claim 5 further comprising a collar associated with each of said plurality of ports and that enable passage of at least one of said plurality of electrical conductors therethrough, said collars suppressing an emission of electromagnetic fields.

7. The distribution box of claim 6 wherein each collar includes a material that is highly resistive to penetration by electromagnetic fields.

8. The distribution box of claim 6 wherein each collar extends from said housing a distance based on a diameter of an associated electrical conductor cable passing therethrough.

9. The distribution box of claim 1 further comprising a bus bar disposed within said housing and that is electrically connected to a first terminal of a power source.

10. The distribution box of claim 9 wherein said mirror plate is electrically connected to a second terminal of said power source.

11. The distribution box of claim 10 further comprising a fuse having a first terminal that is electrically connected to said bus bar and a second terminal that is electrically connected to one of said plurality of electrical conductors.

12. The distribution box of claim 1 further comprising an interlock safety switch that discharges voltage within the distribution box when said housing is opened.

* * * * *